United States Patent
Yamada (10) Patent No.: US 9,778,291 B2
(45) Date of Patent: Oct. 3, 2017

(54) AC INPUT VOLTAGE INTERRUPTION DETECTION METHOD AND CIRCUIT

(75) Inventor: Kouhei Yamada, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 273 days.

(21) Appl. No.: 14/345,399

(22) PCT Filed: Sep. 14, 2012

(86) PCT No.: PCT/JP2012/073746
§ 371 (c)(1),
(2), (4) Date: Jul. 24, 2014

(87) PCT Pub. No.: WO2013/047251
PCT Pub. Date: Apr. 4, 2013

(65) Prior Publication Data
US 2014/0347034 A1   Nov. 27, 2014

(30) Foreign Application Priority Data
Sep. 28, 2011   (JP) ................. 2011-213273

(51) Int. Cl.
*G01R 19/00*   (2006.01)
*G01R 19/12*   (2006.01)
(Continued)

(52) U.S. Cl.
CPC ........... *G01R 19/12* (2013.01); *G01R 19/155* (2013.01); *H02M 1/32* (2013.01)

(58) Field of Classification Search
CPC ........ G01R 19/00; G01R 19/12; G01R 19/25; G01R 19/155; G01R 19/165;
(Continued)

(56) References Cited

U.S. PATENT DOCUMENTS

| 4,788,619 A | * | 11/1988 | Ott ......................... H02H 7/04 340/663 |
| 4,814,934 A | * | 3/1989 | Jones ...................... H02J 9/061 261/91 |

(Continued)

FOREIGN PATENT DOCUMENTS

| JP | S60-67864 A | 4/1985 |
| JP | S63-315963 A | 12/1988 |

(Continued)

*Primary Examiner* — Arleen M Vazquez
*Assistant Examiner* — Steven Yeninas
(74) *Attorney, Agent, or Firm* — Rabin & Berdo, P.C.

(57) ABSTRACT

A selector circuit selects either a class upper-limit voltage or a class lower-limit voltage as a reference voltage of a comparator. A control logic controls the selector circuit, and generates a count-up signal or a count-down signal in accordance with the output of the comparator. An up/down counter counts up upon reception of the count-up signal from the control logic, and counts down upon reception of the count-down signal. A digital-analog converter outputs the class upper-limit voltage and the class lower-limit voltage in accordance with a digital value that is outputted by the up/down counter. A timer circuit is configured to be reset by the count-up signal from the control logic to the up/down counter.

6 Claims, 6 Drawing Sheets

(51) Int. Cl.
*G01R 19/155* (2006.01)
*H02M 1/32* (2007.01)

(58) Field of Classification Search
CPC ........ G01R 19/16528; G01R 19/16566; G01R 19/1659; G01R 19/04; G01R 31/3271; G01R 31/3272; G01R 31/3278; G01R 31/362; G01R 31/42; G01R 31/024; G01R 31/025; G01R 31/026; H02M 1/32; G06F 1/28; G06F 1/30; G06F 1/305; H02H 3/13; H02H 3/20; H02H 3/207; H02H 3/24; H02H 3/247
USPC ....... 324/76.11, 76.13, 76.16, 522, 534, 535, 324/536, 537, 538, 539, 555, 509, 750.01, 324/750.3, 764.01, 76.47, 76.48, 523; 307/115, 116, 125, 126, 128, 130, 131, 307/230, 235, 38, 87; 327/50, 51, 52, 56, 327/58, 60, 62, 72, 74, 75, 78, 79, 89, 94, 327/9, 96; 361/18, 20, 21, 22, 23, 24, 28, 361/33, 54–60, 73, 78, 79, 86, 88, 89, 90, 361/91.3, 94, 195, 42, 91.1, 92, 93.2, 361/187; 323/284
See application file for complete search history.

(56) References Cited

U.S. PATENT DOCUMENTS

| | | | | |
|---|---|---|---|---|
| 5,105,182 A * | 4/1992 | Shindo | ................... | H02H 3/247 340/654 |
| 6,473,280 B1 * | 10/2002 | Buxton | ................... | H02M 1/32 307/140 |
| 8,384,373 B2 * | 2/2013 | Watanabe | ............ | G01R 29/023 324/115 |
| 2008/0252337 A1 * | 10/2008 | Uribe | ..................... | G01R 19/04 327/60 |
| 2009/0121790 A1 * | 5/2009 | Brown | ................... | G01R 19/04 330/279 |
| 2009/0295350 A1 * | 12/2009 | Yamada | ............. | H02M 3/1588 323/282 |
| 2014/0266308 A1 * | 9/2014 | Goltman | ................ | G01R 19/04 327/56 |

FOREIGN PATENT DOCUMENTS

| | | |
|---|---|---|
| JP | S64-73259 A | 3/1989 |
| JP | H10-108451 A | 4/1998 |
| JP | 2009-089490 A | 4/2009 |
| JP | 2009-165305 A | 7/2009 |

* cited by examiner

AC INPUT VOLTAGE INTERRUPTION DETECTION METHOD AND CIRCUIT

TECHNICAL FIELD

The present invention relates to an AC input voltage interruption detection method and a circuit that involve detecting interruption of AC input voltage, and, for instance, shutting off a power supply or discharging capacitor that has been brought to high voltage.

BACKGROUND ART

AC input voltage interruption detection circuits are used for detecting interruption of AC input voltage, and for performing, for instance, shut off of a power supply that is connected with AC input voltage or discharge of capacitor that has been brought to high voltage, and are essential circuits for the safe operation of AC-DC converters and the like.

Figure 1:
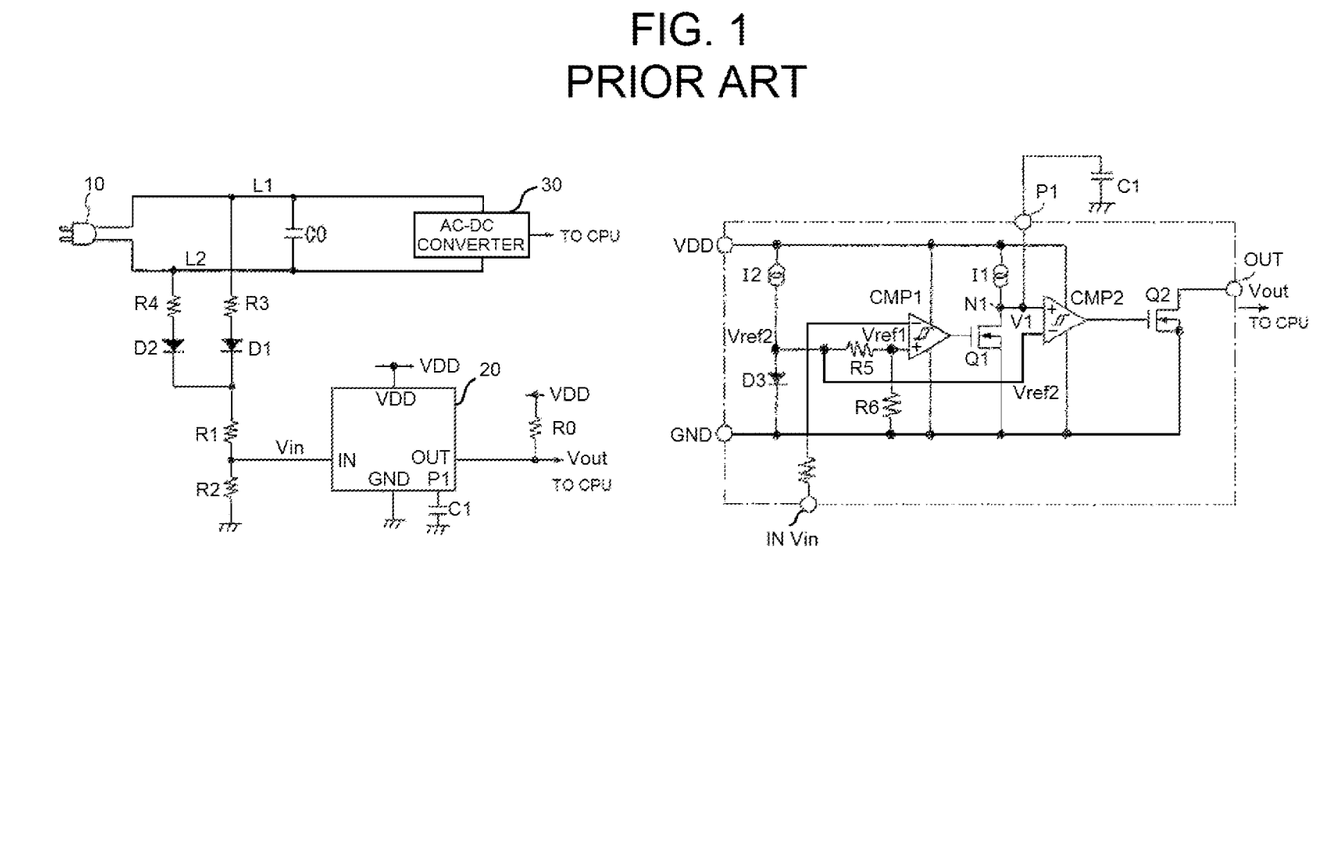
FIG. 1 is a diagram illustrating the configuration of a conventional first AC input voltage interruption detection circuit.
Figure 2:
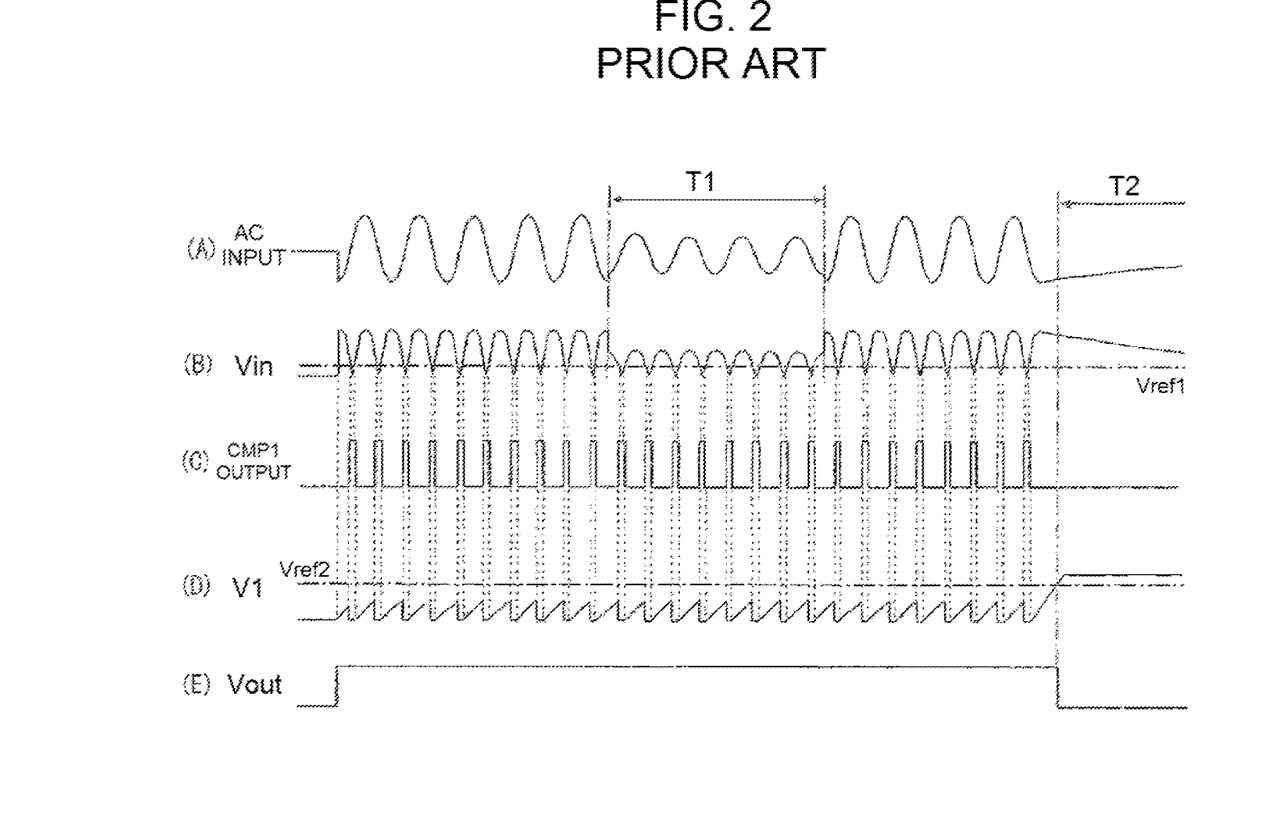
FIG. 2 is a diagram illustrating an operation waveform of the conventional first AC input voltage interruption detection circuit illustrated in FIG. 1.

FIG. 1 and FIG. 2 are diagrams for explaining a conventional first AC input voltage interruption detection circuit, and the operation thereof, as disclosed in Japanese Patent Application Publication No. 2009-165305 (FIG. 1 to FIG. 3). In FIG. 1, the voltage of a filter capacitor C0 follows AC voltage when AC input voltage is connected via a plug that is connected to an AC power supply. However, when the AC input voltage is interrupted for any reason, the AC voltage at that point in time is held at C0, after which the AC voltage is discharged gradually by way of resistors (R1 and R2, and R3 or R4). The AC input voltage is monitored by a detection circuit (detailed circuit illustrated on the right of FIG. 1) via a divided voltage Vin from resistors R1 and R2 by way of a connection point of these resistors. As illustrated on the right end of FIG. 2, AC is determined to be interrupted if a state where Vin does not drop to or below a reference voltage Vref1 lasts for a predefined time that is longer than the AC period.

In a more detailed explanation, the detailed circuit illustrated on the right of FIG. 1 has: a first comparator CMP1 having a hysteresis characteristic and having the input voltage Vin applied to an inverting input terminal thereof; a switch MOSFET Q1, a gate terminal whereof is connected to an output terminal of the comparator CMP1; a constant current source I1 connected between a MOSFET Q1 and a power supply voltage terminal VDD; and a capacitor C1 connected between a ground point and a join node N1 of Q1 and I1. The constant current source I1 charges the capacitor C1 at constant current in the period during which Q1 is off. As a result, when a potential V1 at the node N1 rises gradually and Q1 is switched on, the charge of the capacitor C1 is discharged, whereby the potential V1 is lowered rapidly, to generate thereby a saw-tooth signal.

The detailed circuit illustrated on the right of FIG. 1 also has: a second comparator CMP2 having a hysteresis characteristic and having the potential V1 applied to a non-inverting input terminal thereof; an open-drain output MOSFET Q2, a gate terminal whereof is connected an output terminal of the comparator CMP2; and a constant current source I2, a diode D3, and dividing resistors R5, R6, that generate the reference voltage Vref1 that is applied to the non-inverting input terminal of the first comparator CMP1 and a reference voltage Vref2 that is applied to the inverting input terminal of the second comparator CMP2; wherein the drain terminal of Q2 is connected to an output terminal OUT.

The first comparator CMP1 operates by comparing the input voltage Vin and the reference voltage Vref1, such that when the input voltage Vin becomes higher than Vref1, the output of the comparator falls to a low level, and the MOSFET Q1 is switched off, and when Vin becomes lower than Vref1, the output of the comparator rises to a high level, and Q1 is switched on. When Q1 is switched on, the charge of the capacitor C1 that is connected to the join node N1 of Q1 and I1 is withdrawn, and, as a result, the potential V1 of the node N1 changes to the ground potential. The second comparator CMP2 operates by comparing the potential V1 of the node N1 with the reference voltage Vref2, such that when V1 becomes higher than Vref2, the output of the comparator falls to a low level.

In a further explanation of the operation of the above circuit configuration, the first comparator CMP1 detects an AC waveform and continuously outputs a pulse even if AC voltage drops somewhat, as in period T1 illustrated in FIG. 2. Therefore, the potential V1 of the node N1 does not become higher than Vref2 through periodic resetting of the charge of the capacitor C1, and an output Vout remains at a high level. When, by contrast, the AC waveform disappears, as in period T2 illustrated in FIG. 2, the first comparator CMP1 outputs no more pulses, and the charge of the capacitor C1 is no longer reset. Accordingly, V1 becomes higher than Vref2, the output Vout changes to a low level, and interruption of the AC power supply (AC input voltage interruption) can be notified to the exterior.

Figure 3:
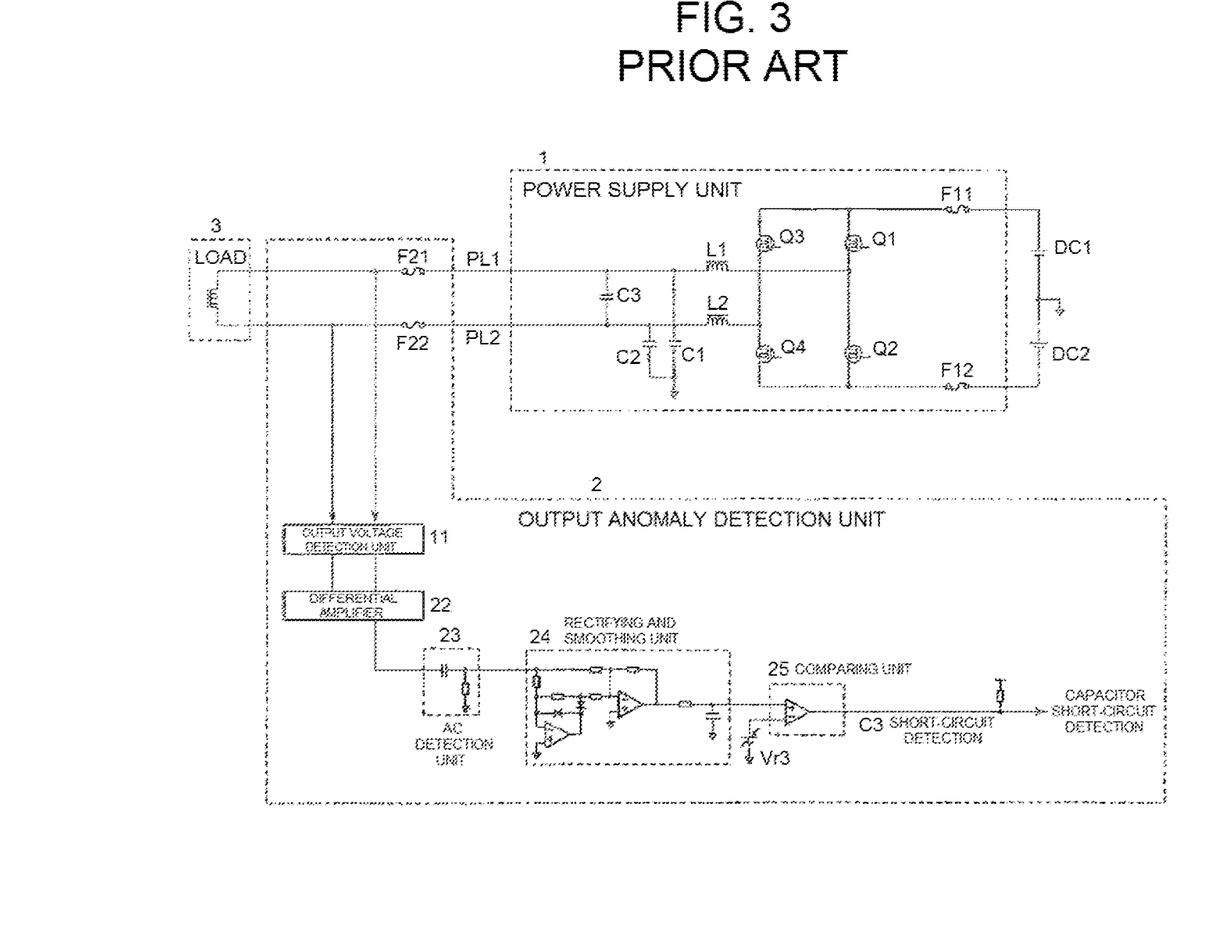
FIG. 3 is a diagram illustrating the configuration of a conventional second AC input voltage interruption detection circuit.
Figure 4:
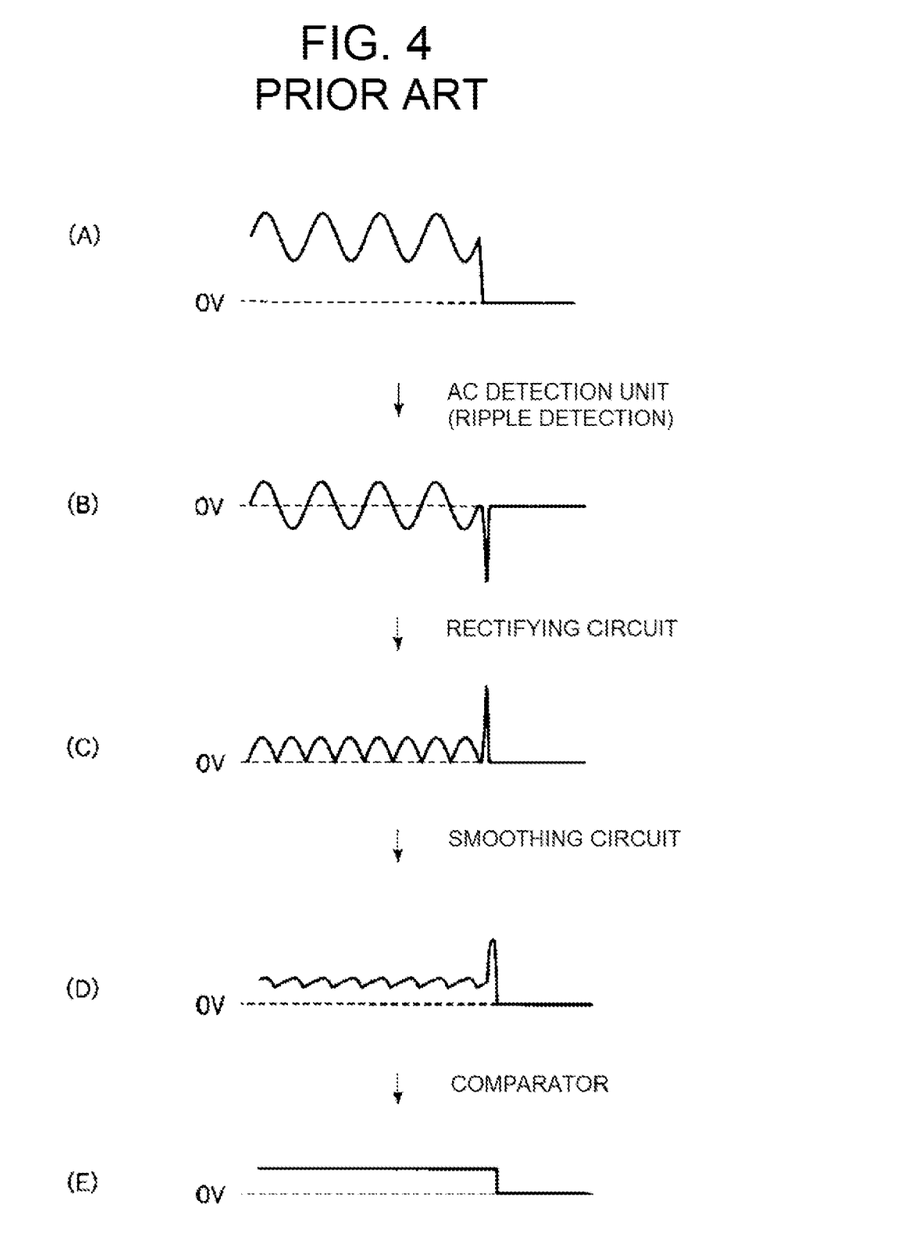
FIG. 4 is a diagram illustrating an operation waveform of the conventional second AC input voltage interruption detection circuit illustrated in FIG. 3.

FIG. 3 and FIG. 4 are diagrams for explaining a conventional second AC input voltage interruption detection circuit, and the operation thereof, as disclosed in Japanese Patent Application Publication No. 2009-89490 (FIG. 2 and FIG. 4). In the circuit shown in FIG. 3, unlike in the case of the conventional first AC input voltage interruption detection circuit illustrated in FIG. 1, a ripple component of detected voltage is extracted by an AC detection unit (high-pass filter), and it is determined that an and AC input voltage is connected if the voltage resulting from rectifying and smoothing the extracted ripple voltage exceeds a reference voltage Vr3.

In a more detailed explanation, a differential amplifier 22 of the circuit of FIG. 3 works out, by way of an output voltage detection unit 11, a difference value of voltage-to-ground detection signals of output power supply lines PL1, PL2; a ripple component is detected by an AC detection unit 23; the ripple component is rectified and smoothed by a rectifying and smoothing unit 24; and a comparing unit 25 compares the result versus the reference voltage Vr3. When a short-circuit fault occurs in a capacitor C3, however, the line voltage between the output power supply lines PL1, PL2 becomes substantially zero, and the ripple component generated between the lines becomes likewise almost zero. As a result, the output signal level of the rectifying and smoothing unit 24 takes on a value of zero or close to zero, and a low-level alarm signal of occurrence of a capacitor short-circuit fault is outputted by the comparing unit 25.

FIG. 4 is a waveform diagram illustrating the details of capacitor short-circuit fault detection of FIG. 3. If capacitors C1 to C3 are in a normal condition, a DC voltage that comprises a switching frequency ripple component by switching elements Q1 to Q4 is applied to the output power supply lines PL1, PL2, and the detection signal by the output voltage detection unit 11 takes on a DC voltage that comprises the ripple component, as illustrated in (A), but becomes almost 0V when the capacitor C3 is shorted. The AC detection unit 23 detects the voltage comprised in the ripple component, as illustrated in (B), such that the detection signal becomes 0V upon shorting of the capacitor C3. As a result, the rectifying and smoothing output signal of the rectifying and smoothing unit 24 becomes 0V when the capacitor C3 is shorted, as illustrated in (C) and (D). The output signal of the comparing unit 25 that compares the rectifying and smoothing output signal with the reference voltage Vr3 is of a high level, as illustrated in (E), if the capacitor C3 is in a normal condition, but takes on a low level of 0V as a result of the occurrence of a short-circuit fault in the capacitor C3. This low-level signal is extracted as an alarm signal of occurrence of a capacitor short-circuit fault.

In the conventional second AC detection circuit scheme described above, the occurrence of the capacitor short-circuit fault is detected through extraction of a ripple component alone. As a result, the below-described problem does not occur, as does in the conventional first AC input voltage interruption detection circuit illustrated in FIG. 1, where the detected voltage is compared with a fixed level.

In the above conventional first AC input voltage interruption detection circuit, the input voltage Vin may in some instances fail to drop down to the reference voltage Vref1, even if, when a time constant, which is based on a capacitive component (including a parasitic capacitance as well as a deliberately added capacitance for surge protection) that is present further toward the detection circuit side than the diodes D1, D2 and which is also based on the resistors (R1, R2) that discharge the capacitive component, is large. In such a case, a problem arises where erroneous determination is made that the AC input voltage is interrupted. If the circuit is used with fixed AC voltage, this problem can be avoided by selecting a reference voltage Vref1 corresponding to a voltage that is slightly lower than the peak value of the AC input voltage, but a problem arises then in that the choice of the reference voltage Vref1 becomes difficult when the AC input voltage range is expanded in worldwide-compliant power-supply specifications.

The above-described conventional second AC input voltage interruption detection circuit does not suffer from the problem of such erroneous determination, as is the case in the conventional first AC input voltage interruption detection circuit, but requires a large resistance and/or capacitance for filtering and rectifying low-frequency components, from about 50 Hz to 60 Hz, and is therefore problematic in that the AC input voltage interruption detection circuit is not suitable for being configured in the form of an integrated circuit.

DISCLOSURE OF THE INVENTION

In order to solve the above problems, it is an object of the present invention to provide an AC input voltage interruption detection method and circuit, suitable for being configured in the form of an integrated circuit, that enables interruption/connection of AC input voltage also in a case where the ripple of detected voltage is small (in a case where the detected voltage does not drop sufficiently).

In order to attain the above goal, the AC input voltage interruption detection method of the present invention includes: determining to which class, from among three or more classes having predefined upper-limit voltages and lower-limit voltages respectively, a detected voltage that corresponds to an AC input voltage belongs, over a period shorter than the period of the AC input voltage, or constantly; and determining that the AC input voltage is interrupted when the class to which the detected voltage has been determined to belong does not change within a predefined time.

The AC input voltage interruption detection method of the present invention is the method above, wherein when the detected voltage exceeds the upper-limit voltage the detected voltage is determined to belong to a next higher class, and when the detected voltage falls below the lower-limit voltage the detected voltage is determined to belong to a next lower class.

The AC input voltage interruption detection method of the present invention allows determining interruption/connection of AC input voltage also in a case where the ripple of detected voltage of inputted AC is small (in a case where the detected voltage does not drop sufficiently).

An AC input voltage interruption detection circuit of the present invention is an AC input voltage interruption detection circuit for carrying out an AC input voltage interruption detection method that involves determining to which class, from among three or more classes having predefined upper-limit voltages and lower-limit voltages respectively, a detected voltage that corresponds to an AC input voltage belongs, and determining that the AC input voltage is interrupted when the class to which the detected voltage has been determined to belong does not change within a predefined time, this AC input voltage interruption detection circuit including: an upper-limit voltage comparator circuit that determines that the detected voltage is higher than the upper-limit voltage; a lower-limit voltage comparator circuit that determines that the detected voltage is lower than the lower-limit voltage; an up/down counter that performs a count-up operation in accordance with an output result of the upper-limit voltage comparator circuit, and that performs a count-down operation in accordance with an output result of the lower-limit voltage comparator circuit; a digital-analog converter that outputs the upper-limit voltage and the lower-limit voltage in accordance with a digital value that is outputted by the up/down counter; and a timer circuit that is reset by the count-up operation or the count-down operation of the up/down counter.

In the above AC input voltage interruption detection circuit of the present invention, preferably, the upper-limit voltage comparator circuit and the lower-limit voltage comparator circuit are configured as one comparator by alternate use, in time division, of a comparator.

In the above AC input voltage interruption detection circuit of the present invention, preferably, sufficient hysteresis width is provided between the upper-limit voltage of a given class and the lower-limit voltage of the next higher class of the class.

In the AC input voltage interruption detection circuit of the present invention, the circuit elements that make up the AC input voltage interruption detection circuit can be realized in the form of elements that are amenable to easy circuit integration, and hence the circuit elements can be easily realized the form of an integrated circuit.

BEST MODE FOR CARRYING OUT THE INVENTION

Embodiments of the present invention are explained next with reference to accompanying drawings.

Figure 5:
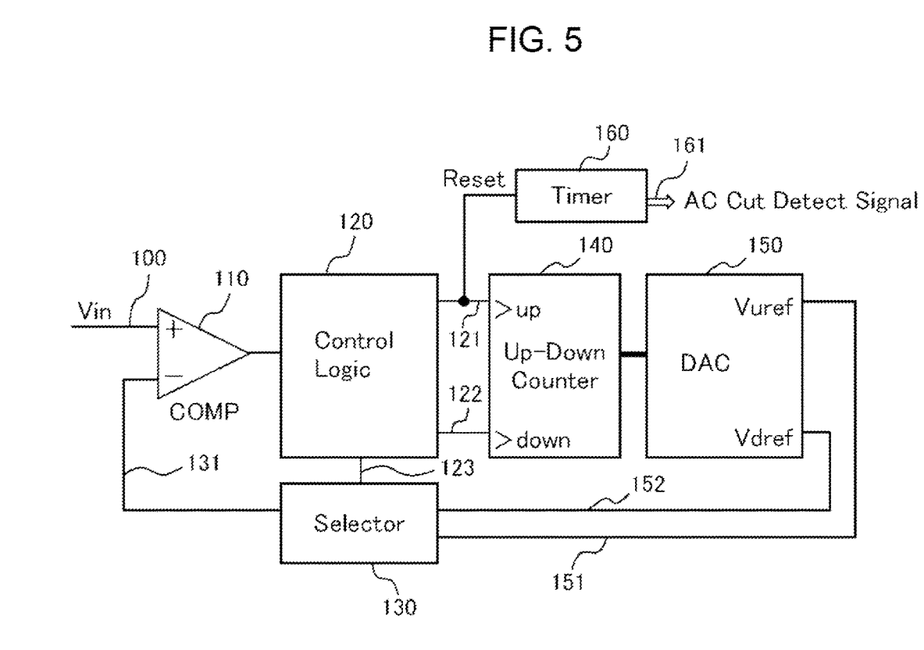
FIG. 5 is a diagram illustrating the configuration of an AC input voltage interruption detection circuit according to an embodiment of the present invention.

FIG. 5 is a diagram illustrating the configuration of an AC input voltage interruption detection circuit according to an embodiment of the present invention. The AC input voltage interruption detection circuit illustrated in FIG. 5 is made up of: a selector circuit 130 that selects either a class upper-limit voltage Vuref (151) or a class lower-limit voltage Vdref (152), as a reference voltage of a comparator 110, and that outputs the selection as a selector circuit output (131); a control logic 120 that controls the selector circuit 130, and that generates a count-up signal 121 or count-down signal 122 in accordance with the output of the comparator 110; an up/down counter 140 that counts up upon reception of the count-up signal 121 from the control logic 120, and that counts down upon reception of the count-down signal 122; a digital-analog converter 150 that outputs the class upper-limit voltage Vuref (151) and the class lower-limit voltage Vdref (152) in accordance with the digital value that is outputted by the up/down counter 140; and a timer circuit 160 that is reset by the count-up signal 121 from the control logic 120 to the up/down counter 140.

FIG. 5 illustrates an example wherein the timer circuit 160 is reset by the count-up signal 121 from the control logic 120. However, the timer circuit 160 is not limited thereto, and may be reset by the count-down signal 122 from the control logic 120. Alternatively, the timer circuit 160 may be reset by the result of a logical sum of the count-up signal 121 and the count-down signal 122. Although the method for detecting the detection signal Vin in FIG. 5 is not specifically explained, the detection signal Vin is voltage resulting from dividing the AC input voltage according in accordance with full-wave rectification or half-wave rectification. For instance, it is possible to detect divided voltage resulting from full-wave rectification in the same way as in the circuit illustrated in FIG. 1, and to detect divided voltage resulting from half-wave rectification, if any one element is omitted in the set of the diode D1 and the resistor R3, and the set of the diode D2 and the resistor R4. It is determined that AC input voltage is interrupted if the timer circuit 160 completes a time-count without being reset.

The control logic 120 repeats the operations (1) to (4) below over a short enough period with respect to the period of the AC input voltage (on the premise that this is not problematic in terms of the response speed of the comparator 110).

(1) The Vuref (151) by the control signal 123 is selected as the reference voltage of the comparator 110, and is added to the inverting input terminal of the comparator 110.

(2) Upper-limit voltage comparison: the count-up signal 121 is outputted if the output result of the comparator 110 is Vin (100)>Vuref (151) (Vuref, Vdref vary by the output result of the up/down counter 140).

(3) Vdref (152) by the control signal 123 is selected as the reference voltage of the comparator 110, and is added to the inverting input terminal of the comparator 110.

(4) Lower-limit voltage comparison: the count-down signal 122 is outputted if the output result of the comparator 110 is Vin (100)<Vdref (152) (Vuref, Vdref vary by the output result of the up/down counter 140).

Figure 6:
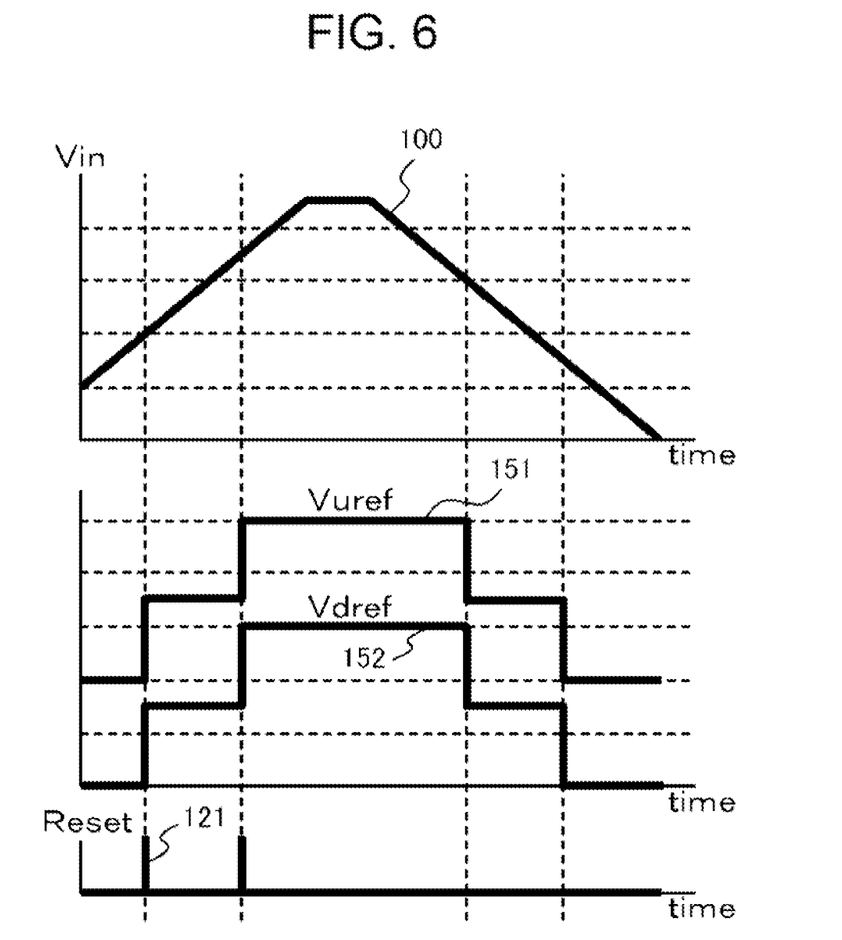
FIG. 6 is a diagram illustrating an operation waveform of the AC input voltage interruption detection circuit illustrated in FIG. 5.

FIG. 6 is a diagram illustrating an operation waveform of the AC input voltage interruption detection circuit illustrated in FIG. 5. The broken lines parallel to the abscissa axis (time axis) of FIG. 6 are graph grid lines. FIG. 6 illustrates the manner (middle section in the illustrated example) in which the class upper-limit voltage Vuref (151) and the class lower-limit voltage Vdref (152) vary with respect to the detection signal Vin (100) that is depicted at the top of the illustrated example. Once Vin (100)>Vuref (151) holds true as the detection signal Vin (100) rises, the count-up operation is executed, the output of the up/down counter 140 varies in response thereto, and the values of Vuref (151) and Vdref (152) rise stepwise. The count-up operation is executed again, in the same manner, when Vin (100)>Vuref (151) holds once more. On the other hand, once Vin (100)<Vdref (152) holds true as the detection signal Vin (100) drops, the count-down operation is executed, the output of the up/down counter 140 varies in response thereto, and the values of Vuref (151) and Vdref (152) drop stepwise.

If the AC input voltage is connected, the detection signal Vin (100) exhibits a change such that the detection signal Vin (100) has a magnitude comparable to that of a pre-defined period. Therefore, the count-up signal 121 and the count-down signal 122 are outputted by the control logic 120. FIG. 6 illustrates the reset signal 121 at the bottom. Herein, the timer circuit 160 is configured to be reset by the count-up signal 121 (or the count-down signal 122), and hence no time-out occurs while the AC input voltage is connected.

If the AC input voltage is interrupted, on the other hand, the detection signal Vin (100) just drops gradually, the timer circuit 160 times out, for instance, when a time-count of 50 ms to 100 ms is reached, without generation of the count-up signal 121 and the count-down signal 122 by the control logic 120, and an AC interruption detection signal 161 is outputted by the timer circuit 160.

In the example illustrated at the middle section of FIG. 6, the upper-limit voltage Vuref (151) and the lower-limit voltage Vdref (152) each have three classes (digital values). The value of the upper-limit voltage Vuref (151) corresponding to a given class (digital value) is set to a slightly higher value than the value of the lower-limit voltage Vdref (152) corresponding to the next higher class (digital value). Specifically, a difference (hysteresis width) arises between the level at which the count-up signal 121 is generated during rising of the detection signal Vin (100) and the level at which the count-down signal 122 is generated during falling of the detection signal Vin (100). The purpose of this is to prevent fluttering of the count value in the vicinity of a class switch-over.

The upper-limit voltage comparator circuit and the lower-limit voltage comparator circuit have been explained in a configuration example in which one comparator 110 is used in time-division, through the use of the control logic 120 and the selector circuit 130. However, the upper-limit voltage comparator circuit and the lower-limit voltage comparator circuit may be configured out of different comparators. In this case, it becomes possible to constantly determine (not discretely, as described above) to which class, from among three or more classes having predefined upper-limit voltages and lower-limit voltages respectively, a detected voltage that corresponds to an AC input voltage belongs. However, the above-described hysteresis width is preferably set to be somewhat large, to account for the influence of offset variability among the comparators.

The AC input voltage interruption detection method and circuit of the present invention are not limited to being compliant with Japanese specifications, where power supply specifications for AC input voltage ranges are narrow, but can also be suitably used in a wide variety of worldwide-compliant power-supply specifications.

The invention claimed is:

1. An AC input voltage interruption detection method using an up/down counter, comprising the steps of:
   maintaining a count by the up/down counter, each count having an upper-limit voltage and a lower-limit voltage associated thereto;
   repeatedly detecting a voltage that corresponds to an AC input voltage;
   for each detected voltage,
      comparing said each detected voltage with the upper-limit voltage associated to the count, and generating a count-up signal upon determining that the detected voltage is higher than the upper-limit voltage,
      comparing the detected voltage with the lower-limit voltage associated to the count, and generating a count-down signal upon determining that the detected voltage is lower than the lower-limit voltage, and
      increasing or decreasing the count by one in response respectively to the count-up or count-down signal; and
   determining that the AC input voltage is interrupted when no reset signal is generated within a predefined time, wherein
   the reset signal is one of the count-up signal, the count-down signal and a logical sum of the count-up and count-down signals.

2. The AC input voltage interruption detection method according to claim 1, wherein
   the upper-limit voltage associated to the count is one of three or more stepwise upper-limit voltages, and
   the lower-limit voltage associated to the count is one of three or more stepwise lower-limit voltages that respectively correspond to the stepwise upper-limit voltages.

3. The AC input voltage interruption detection method according to claim 1, wherein the upper-limit voltage at each step is higher than the lower-limit voltage value at the next higher step thereof.

4. An AC input voltage interruption detection circuit comprising:
   an up/down counter that maintains a count, each count having an upper-limit voltage and a lower-limit voltage associated thereto;
   a digital-analog converter that converts the count to the upper-limit voltage and the lower-limit voltage;
   a voltage comparator circuit that repeatedly receives voltages corresponding to an AC input voltage, and, for each received voltage,
      generates a count-up signal upon determining that said each received voltage is higher than the upper-limit voltage associated to the count, and
      generates a count-down signal upon determining that said each received voltage is lower than the lower-limit voltage associated to the count;
   and
   a timer circuit that outputs a signal indicating that the AC input voltage is interrupted when no reset signal is received thereby within a predefined time, wherein
   the up/down counter increases the count by one in response to each count-up signal, and decreases the count by one in response to each count-down signal, and
   the reset signal is one of the count-up signal, the count-down signal and a logical sum of the count-up and count-down signals.

5. The AC input voltage interruption detection circuit according to claim 4, wherein
   the upper-limit voltage associated to the count is one of three or more stepwise upper-limit voltages,
   the lower-limit voltage associated to the count is one of three or more stepwise lower-limit voltages that respectively correspond to the stepwise upper-limit voltages, and
   the upper-limit voltage at each step is higher than the lower-limit voltage at the next higher step thereof.

6. The AC input voltage interruption detection method according to claim 1, wherein the comparing steps are carried out over a period shorter than a period of the AC input voltage.

* * * * *